(12) United States Patent
Chujo et al.

(10) Patent No.: US 6,226,768 B1
(45) Date of Patent: May 1, 2001

(54) CODED FRAME SYNCHRONIZING METHOD AND CIRCUIT

(75) Inventors: Kaoru Chujo; Naoji Fujino, both of Kawasaki; Toshiaki Nobumoto, Fukuoka; Tomonobu Takashima; Noboru Kobayashi, both of Kawasaki; Miki Murakawa; Toshiyuki Ohta, both of Fukuoka, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/067,105

(22) Filed: Apr. 28, 1998

(30) Foreign Application Priority Data

Nov. 12, 1997 (JP) .................................................. 9-310207

(51) Int. Cl.7 .................................................. G06F 11/00
(52) U.S. Cl. .......................................... 714/746; 714/798
(58) Field of Search ...................................... 714/746, 798

(56) References Cited

U.S. PATENT DOCUMENTS 5,862,153 * 1/1999 Kikuchi et al. ......................... 371/42

6,118,825 * 9/2000 Ikeda et al. .......................... 375/259

FOREIGN PATENT DOCUMENTS

| 62-53040 | 3/1987 | (JP) . |
| 63-1128 | 1/1988 | (JP) . |
| 2-57057 | 2/1990 | (JP) . |
| 5-211499 | 8/1993 | (JP) . |
| 6-85808 | 3/1994 | (JP) . |
| 8-191296 | 7/1996 | (JP) . |

* cited by examiner

*Primary Examiner*—Phung M. Chung
(74) *Attorney, Agent, or Firm*—Helfgott & Karas, P C.

(57) ABSTRACT

A coded frame synchronization method for decoding coded information sent every frame includes the steps of: (a) receiving a coded frame having error detection or correction codes, each of which is provided every predetermined number of bits, error detection or correction codes being added to the coded frame in accordance with a predetermined pattern; (b) pulling the coded frame in synchronization by performing an error detection process every predetermined number of bits to be compared with results of the error detection process and thus detecting a phase of the error detection or correction codes; and (c) recognizing a leading end of the coded frame on the basis of the phase of the error detection or correction codes.

13 Claims, 10 Drawing Sheets

CODED FRAME SYNCHRONIZING METHOD AND CIRCUIT

BACKGROUND OF THE INVENTION

1. Field of the Invention

The present invention relates to a coded frame synchronizing method and circuit directed to coded information processed every frame such as voice codec and image codec.

In a multimedia multiplexing transmission system, it is required to pull transmit and receive operations in synchronization when a system is switched. Particularly, it is desired to establish the synchronization without any error with a time as short as possible. The voice codec and the image codec perform coding and decoding processes on the frame base. Hence, it is required that a frame synchronization be established between the coding and decoding parts. It is also required that a transmission error be detected and corrected in order to prevent the qualities of reproduced voice and image from being degraded.

2. Description of the Related Art

A synchronization code is added to coded information every frame in the voice codec and image codec in the multimedia multiplexing transmission system. Additionally, an error detection code or an error correction code may be added to the frame-base coded information. Parity bits function to detect a transmission error. A CRC (Cyclic Redundancy Check) code also functions to detect a transmission error. A BCH (Bose-Chaudhuri-Hocquenghen) code functions to correct a transmission error. The synchronization code is designed to be a frame synchronizing code having a unique pattern composed of a plurality of bits or a single-bit structure synchronization code and form a unique pattern over a plurality of frames.

On the receive side, the frame synchronization is established by detecting the synchronization code, and the coded information having a predetermined number of bits is extracted based on the detected synchronization code. Hence, the frame-based decoding process can be realized.

The coded frame has a length equal to, for example, 10 ms or 15 ms, and it is designed to reduce the number of times that the synchronization code is added in order to improve the transmission efficiency. The coded frame is sent by a transmission frame dependent on a transmission path such as a wire line or a radio channel. Hence, there are many cases where the coded frame differs from the transmission frame.

The coded information produced by the voice codec has a comparatively large correlation between the frames of coded information. If a transmission error occurs in the coded information of a coded frame, this coded frame is discarded, and the coded information of the previous coded frame is subjected to the reproduction process again. Hence, it is possible to suppress degradation of the quality of voice reproduced from coded information having a transmission error.

The error detection code such as the parity bits or the error correction code such as the BCH code is added in order to detect a transmission error in the coded information. The parity bits are added to the position of the synchronization bits, and the detection of the parity bits are detected by a parity check operation. Hence, the coded frame is pulled in synchronization (see, for example, Japanese Laid-Open Patent Application No. 62-53040). Another synchronizing method is known in which check bits are added to the coded frame instead of the synchronization code thereof and an error in the coded frame is detected (see, for example, Japanese Laid-Open Patent Application No. 63-1128).

As described above, the error detection code such as the parity bits or the error correction code such as the BCH code can be used as the synchronization code for the frame-base coded information. When the synchronization code is used, it is required to 1) pull the coded frame in synchronization as quickly as possible, 2) maintain the synchronized state without being affected by a fine transmission error, and 3) prevent occurrence of a pseudo-pulled-in-synchronization state.

In order to speed up the pulling-in operation, the synchronization code is generally designed to have a unique pattern which does not occur in any encoded information. However, the above synchronization code degrades the transmission efficiency. When the error detection code or the error correction code is used instead of the synchronization code as described above, degradation of the transmission efficiency can be prevented but there is a comparatively high possibility that the pseudo-pulled-in-synchronization state may occur. If the decoding process is carried out in the pseudo-pulled-in-synchronization state, the quality of reproduced voice and image will greatly be degraded.

SUMMARY OF THE INVENTION

It is a general object of the present invention to provide a coded frame synchronization method and circuit in which the above disadvantages are eliminated.

A more specific object of the present invention is to provide a coded frame synchronization method and circuit capable of pulling a coded frame in synchronization while avoiding occurrence a pseudo-synchronized state.

The above objects of the present invention are achieved by a coded frame synchronization method for decoding coded information sent every frame, comprising the steps of: (a) receiving a coded frame having error detection or correction codes, each of which is provided every predetermined number of bits, error detection or correction codes being added to the coded frame in accordance with a predetermined pattern; (b) pulling the coded frame in synchronization by performing an error detection process every predetermined number of bits to be compared with results of the error detection process and thus detecting a phase of the error detection or correction codes; and (c) recognizing a leading end of the coded frame on the basis of the phase of the error detection or correction codes.

The above objects of the present invention are also achieved by a coded frame synchronization method for decoding various types of coded information sent every frame, comprising the steps of: (a) receiving a coded frame having error detection or correction codes, each of which is provided every predetermined number of bits, error detection or correction codes being added to the coded frame in accordance with a predetermined pattern; (b) receiving another coded frame of a particular type having particular type indication codes rather than the error detection or correction codes; (c) pulling the coded frame in synchronization by performing an error detection process every predetermined number of bits to be compared with results of the error detection process and thus detecting a phase of the error detection or correction codes; (d) pulling the another coded frame in synchronization by detecting a phase of the particular type indication codes; (e) recognizing a leading end of the coded frame on the basis of the phase of the error detection or correction codes; and (f) recognizing a leading end of the another frame on the basis of the phase of the particular type indication codes.

The above objects of the present invention are also achieved a coded frame synchronization method for decoding coded information sent every frame, comprising the steps of: (a) receiving a coded frame having error detection or correction codes, each of which is provided every predetermined number of bits, error detection or correction codes being added to the coded frame in accordance with a predetermined pattern; (b) receiving another coded frame having special synchronization codes rather than the error detection or correction codes if the error detection or correction codes are not duly received at step (a); (c) pulling the coded frame in synchronization by performing an error detection process every predetermined number of bits to be compared with results of the error detection process and thus detecting a phase of the error detection or correction codes; (d) pulling, if the step (c) fails over a number of stages for backward protection, the another coded frame in synchronization by detecting a phase of the special synchronization codes; (e) recognizing a leading end of the coded frame on the basis of the phase of the error detection or correction codes; and (f) recognizing a leading end of the another frame on the basis of the phase of the special synchronization codes.

The above objects of the present invention are also achieved by a coded frame synchronization method for decoding coded information sent every frame, comprising the steps of: (a) receiving a coded frame having error detection or correction codes, each of which is provided every predetermined number of bits, error detection or correction codes being added to the coded frame in accordance with a predetermined pattern; (b) receiving another coded frame having special codes rather than the error detection or correction codes; (c) pulling the coded frame in synchronization by performing an error detection process every predetermined number of bits to be compared with results of the error detection process and thus detecting a phase of the error detection or correction codes; (d) recognizing a leading end of the coded frame on the basis of the phase of the error detection or correction codes; and (e) recognizing that a synchronization is not established if the step (c) fails over a number of stages for backward protection or the special codes are detected.

The above method may further comprise the steps of: maintaining, if the current state is changed from a synchronized state to an out-of-synchronization state, a phase of the synchronized state immediately before the current state is changed; and pulling the coded frame with the phase maintained.

The above objects of the present invention are also achieved by a coded frame synchronization method for decoding coded information sent every frame, comprising the steps of: (a) receiving a coded frame having error detection or correction codes, each of which is provided every predetermined number of bits, error detection or correction codes being added to the coded frame in accordance with a predetermined pattern; (b) pulling the coded frame in synchronization by performing an error detection process every predetermined number of bits to be compared with results of the error detection process and thus detecting a phase of the error detection or correction codes; (c) pulling the coded frame in synchronization with phases other than the phase of the error detection or correction codes; (d) determining that a synchronization is not yet established if there are a plurality of phases with which the synchronization can be established; and (e) recognizing that the synchronization is established if the coded frame can continuously be pulled, for a number of stages for backward protection, in synchronization with only one of the phrases.

The above objects of the present invention are also achieved by a coded frame synchronization method for decoding coded information sent every frame, comprising the steps of: (a) receiving a coded frame having error detection or correction codes, each of which is provided every predetermined number of bits, error detection or correction codes being added to the coded frame in accordance with a predetermined pattern; (b) pulling the coded frame in synchronization by performing an error detection process every predetermined number of bits to be compared with results of the error detection process and thus detecting a phase of the error detection or correction codes; (c) pulling the coded frame in synchronization with phases other than the phase of the error detection or correction codes; (d) storing a frequency of occurrence of an out-of-synchronization for each of the phases with which the coded frame is pulled in synchronization; (e) comparing a first frequency of occurrence of the out-of-synchronization related to a current phase for a number of stages for forward protection with second frequencies of occurrence of the out-of-synchronization with other phases; and (f) reducing the number of stages for forward protection when the first frequency is greater than the second frequencies.

The above objects of the present invention are also achieved by a coded frame synchronization circuit which decodes coded information sent every frame, comprising: an error detection part which receives a coded frame having error detection or correction codes, each of which is provided every predetermined number of bits, error detection or correction codes being added to the coded frame in accordance with a predetermined pattern and which performs an error detection process every predetermined number of bits; a compare part which compares the error detection or correction codes extracted from the coded frame with results of the error detection process carried out by the error detection part in accordance with the predetermined pattern; a synchronization decision part which determines that a synchronization is established when a match signal from the compare part is repeatedly received a number of times equal to a number of stages for backward protection and which determines that an out-of-synchronization occurs when a mismatch signal from the compare part is repeatedly received in a synchronized state the number of times equal to the number of stages for backward protection.

The above coded frame synchronization circuit may be configured so that: the error detection part has a structure which receives another coded frame of a particular type having particular type indication codes rather than the error detection or correction codes and which performs the error detection process for another coded frame; the compare part has a structure which compares the particular type indication codes extracted from the coded frame with results of the error detection process carried out by the error detection part in accordance with the predetermined pattern; and the match signal used in the synchronization decision part is related to the error detection or correction codes or the particular type indication codes.

The above coded frame synchronization circuit may be configured so that: the error detection part has a structure which receives another coded frame having special synchronization codes rather than the error detection or correction codes if the error detection or correction codes are not duly received; the compare part has a structure which compares the special synchronization codes extracted from the coded frame with results of the error detection process carried out by the error detection part in accordance with the predetermined pattern; and the synchronization decision part includes a backward protection part which counts the number of times that a match signal from the compare part is received, and a forward protection part which counts the number of times that a mismatch signal from the compare part is received, the synchronization decision part controlling the error detection part to detect the special synchronization codes when the backward protection circuit fails to count the match signal a number of times equal to a number of stages for backward protection by the backward protection circuit.

The above coded frame synchronization circuit may be configured so that: the error detection part has a structure which receives another coded frame having special codes rather than the error detection or correction codes if the synchronization cannot be established with the error detection or correction codes; the compare part has a structure which compares the special codes extracted from the coded frame with results of the error detection process carried out by the error detection part in accordance with the predetermined pattern; and the synchronization decision part includes a backward protection part which counts the number of times that a match signal from the compare part is received, and a forward protection part which counts the number of times that a mismatch signal from the compare part is received, the synchronization decision part controlling the error detection part to detect the special codes when the backward protection circuit fails to count the match signal a number of times equal to a number of stages for backward protection by the backward protection circuit.

The above coded frame synchronization circuit may be configured so that: the compare part compares the error detection or correction codes extracted with different frames from the coded frame with results of the error detection process carried out by the error detection part with different phrases in accordance with the predetermined pattern; and the synchronization decision part includes a backward protection part which counts the number of times that a match signal from the compare part is received, and a forward protection part which counts the number of times hat a mismatch signal from the compare part is received, the synchronization decision part determining that the synchronization is established when the backward protection circuit counts, with respect to only one of the phrases, the match signal a number of times equal to a number of stages for backward protection by the backward protection circuit.

The above coded frame synchronization circuit may be configured so that: the compare part compares the error detection or correction codes extracted with different frames from the coded frame with results of the error detection process carried out by the error detection part with different phrases in accordance with the predetermined pattern; and the synchronization decision part includes a backward protection part which counts the number of times a match signal from the compare part is received, a forward protection part which counts the number of times that a mismatch signal from the compare part is received, and a decision output part which temporarily reduces the number of stages for forward protection by the forward protection pat when the count value of the forward protection part with respect to the phase with which the synchronization is established becomes less than the count values of the forward protection part with respect to the other phrases.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
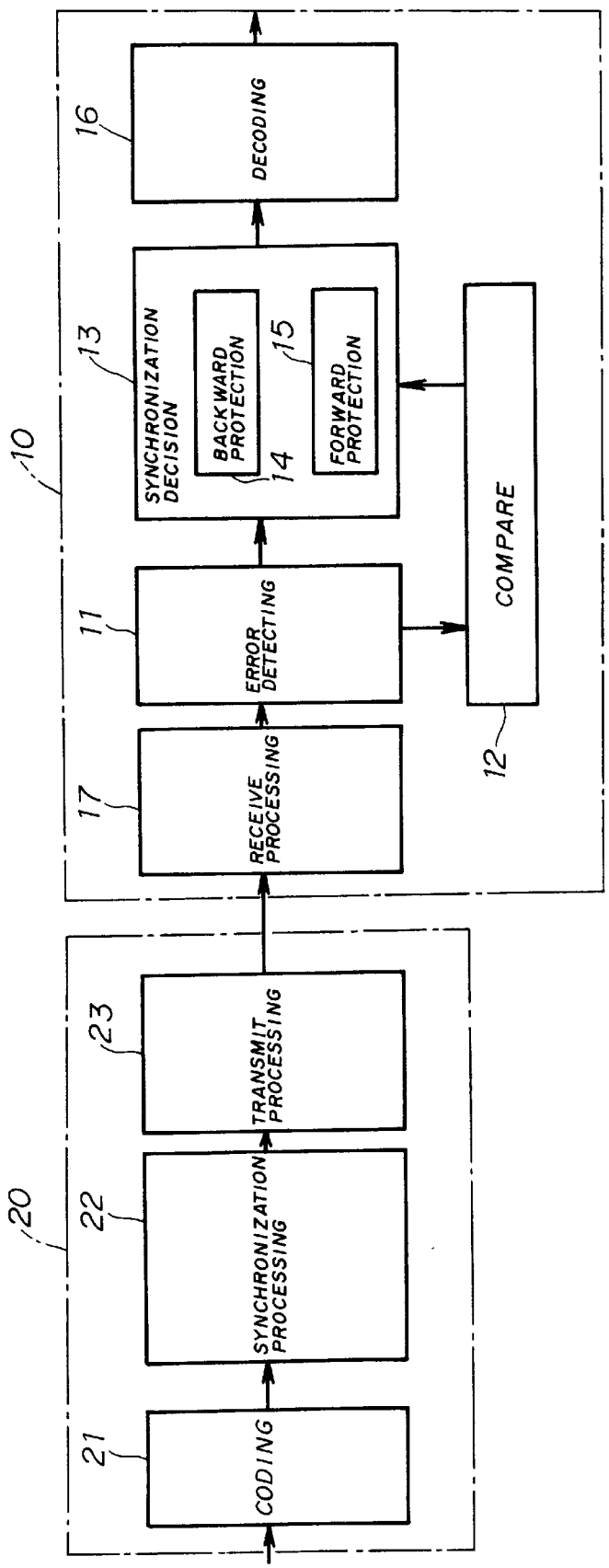
FIG. 1 is a block diagram of a first embodiment of the present invention.

FIG. 1 is a block diagram of a first embodiment of the present invention. A transmit device 20 includes a coding part, a synchronization processing part 22 and a transmit processing part 23. The coding part 21 compresses and encodes a voice signal or an image (video) signal, and applies coded information thus generated for each frame to the synchronization processing part 22. Then, synchronization processing part 22 generates an error detection code such as parity bits or an error correction code such as the BCH code every frame of the coded information or every predetermined number of bits among the bits forming the coded information. Then, the part 22 adds the error detection or correction code to a given position, so that a coded frame is formed. The transmit processing part 23 sends the coded frame to a transmission path without any modification or sends a modified transmission frame corresponding to the transmission path. The coded or modified coded frame is then transferred over the transmission path and is received by a receive device 10.

In the process of the synchronization processing part 22, the error detection code or the error correction code is arranged to have a unique pattern, which is then added. For example, when the parity bits are used, a pattern of a combination of an odd parity, an even parity, an even parity and an odd parity, or a pattern in which all parities are either even parities or odd parities and are inverted or non-inverted. Similarly, when the CRC code is used, it is possible to determine, in accordance with a predetermined pattern, whether the inversion or non-inversion should be selected. The above holds true for the error correction code such as the BCH code.

The receive part 10 includes a receive processing part 17, an error detection part 11, a compare part 12, a synchronization decision part 13, and a decoding part 16. The receive processing part 17 performs a receive process corresponding to the transmission frame proposed by the transmit processing part 23, and supplies the coded frame to the error detection part 11. The error detection part 11, the compare part 12 and the synchronization decision part 13 form a coded frame synchronization circuit. The synchronization decision part 13 includes a forward protection circuit 14 and a backward protection circuit 15. The error detection part 11 performs an error detecting operation every coded information of a predetermined number of bits. The compare part 12 compares the result of the error detecting operation with the error detection code or the error correction code, and supplies the synchronization decision part 13 with the comparison result. The backward protection circuit 14 counts up a mismatch signal successively supplied from the compare part 12 in an out-of-synchronized state. When the count value becomes equal to the number of stages for backward protection, the circuit 14 determines that the receive system signal is pulled in synchronization. The forward protection circuit 15 counts up a mismatch signal successively supplied from the compare part 12 in a synchronized state. When the count value becomes equal to the number of stages for forward protection, the circuit 15 determines that the receive system is out of synchronization.

Figure 2:
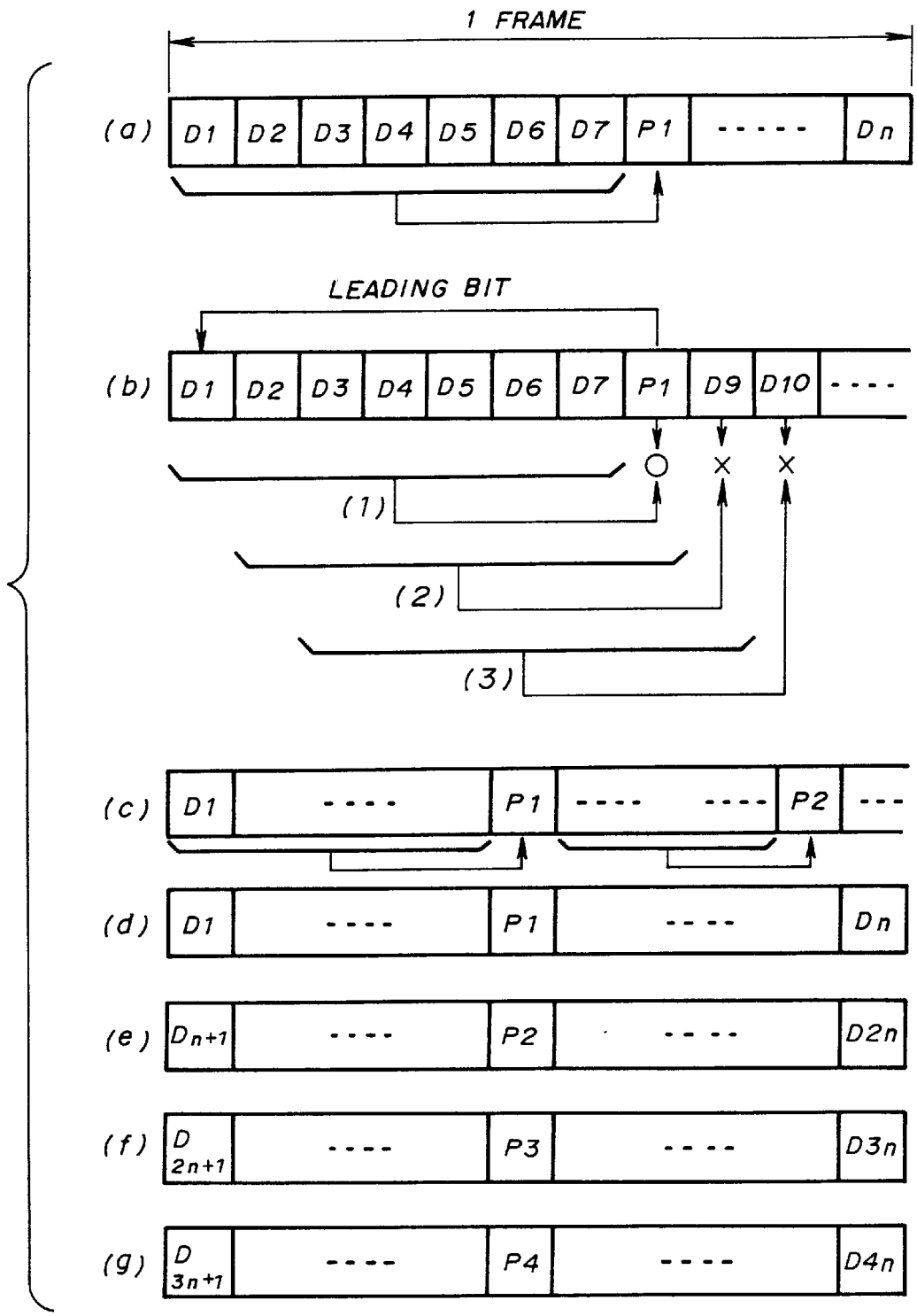
FIG. 2 is a diagram of a coded frame used in the first embodiment of the present invention.

FIG. 2 is a diagram showing the coded frame used in the first embodiment of the present invention. FIG. 2(a) shows the coded frame produced by the transmit device 20 in which the predetermined number of bits of coded information is set equal to 7. The synchronization processing part 22 adds a parity bit P1 which is the result of an exclusive-OR operation on bits D1–D7 of the coded information. In this case, the seventh bit obtained by counting, starting from the position in which the parity bit P1 of the coded frame is detected, towards the leading position thereof. Alternatively, an error detection code or an error correction code obtained by an operation on all the bits of coded information equal to one frame may be added to the end of the frame or the leading position thereof.

When the coded frame shown in FIG. 2(a) is employed, the compare part 12 of the receive device 10 compares the parity bit obtained by the exclusive-OR operation carried out every seven bits with the parity bit which is the eighth bit added to the coded frame. Hence, a plurality of parity bits are added to the coded frame.

In FIG. 2(a), the parity bit obtained by the exclusive-OR operation on the bits D1–D7 with the parity bit P1 which is the eight bit of the coded frame, as indicated by (1) shown in FIG. 2(b). Since the operation result coincides with the parity bit P1, the compare part 12 outputs the match signal as indicated by symbol "o". In cases (2) and (3) shown in FIG. 2(b), the eight bits are respectively coded information bits D9 and D10. Hence, the compare part 12 outputs the mismatch signals as indicated by simple "x". When the number of times that the match signal is successively obtained is equal to the number of stages for the backward protection, it is determined that the received signal be pulled in synchronization and the position which leads, by seven bits, to the position at which the parity bit P1 is detected be the leading position of the coded frame. Hence, the decoding process is started from the determined leading position of the frame.

FIG. 2(c) shows a frame arrangement in which a plurality of parity bits P1, P2, . . . are added to the coded frame. If four parity bits P1, P2, P3 and P4 are added to one frame, a pattern is formed by inverting the parity bits P2 and 3 while the parity bits P1 and P4 are not inverted. More particularly, when the parity bit P1 is "0" or "1", the parity bit P1 itself is added to the frame. This holds true for the parity bit P4. When the parity bit P2 is "0", the inverted bit "1" is added to the frame. Similarly, when the parity bit P2 is "1", the inverted bit "0" is added to the frame. The above holds true for the parity bit P3. Another pattern different from the above pattern can be employed.

The receive unit 10 compares the results of the parity operation with the parity bits P1, P2, P3 and P4. The results of the parity operation are inverted or not in accordance with the above-mentioned parity bit inversion/non-inversion pattern. When the parity bits P1, P2, P3 and P4 coincide with the corresponding operation results, the present frame is pulled in synchronization. In practice, the backward protection circuit 15 shown in FIG. 1 counts the number of times that the operation result coincides with the corresponding parity bit in order to avoid the pseudo-pulled-in-synchronization state. When the counted number coincides with the number of stages for the backward protection, the pull-in operation is completed. Then, the next frame is processed so that the bit which leads, by the predetermined number of bits, to the position at which the parity bit P1 is detected is the leading position of the present frame. Then, the decoding part 16 starts the decoding process from the detected leading position of the frame.

FIGS. 4(d)–4(g) show that four frames respectively including coded information bits D1–Dn, Dn+1–D2n, D2n+1–D3n and D3n+1–D4n have respective single parity bits P1, P2, P3 and P4. These parity bits P1, P2, P3 and P4 are inverted or not so that a predetermined pattern is formed as in the above-mentioned case where a plurality of parity bits are added to one frame. The parity bits P1–P4 are the results of the respective exclusive-OR operations on the bits located between the leading ends of the respective frames and the bits located immediately before the parity bits P1–P4. The remaining bits of the frames in which the last bits are Dn, D2n, D3n and D4n are not subjected to the parity operation. Alternatively, the parity bits P2, P3 and P4 other than the parity bit P1 for the first frame may be subjected to the exclusive-OR operations on the bits equal to one frame. For example, the parity bit P2 is obtained by the exclusive-OR operation on the remaining bits of the first frame located after the parity bit P1 and the bits of the second frame located before the parity bit P2.

When the parity bits P1–P4 extracted from the four frames received coincide the predetermined pattern, the compare part 12 outputs the match signal to the synchronization decision part 13. The backward protection circuit 14 counts the number of times that the match signal is received. When the number becomes equal to the number of stages for the backward protection, it is determined that the pull-in operation is completed. Then, the next four frames are processed so that the positions which lead to the parity bits P1–P4 of the next frames by the predetermined number of bits are the leading ends thereof. The decoding part 16 decodes the frames from the respective leading ends. It can be seen from the above that the parity bits can be located in any position in the frames.

Figure 3:
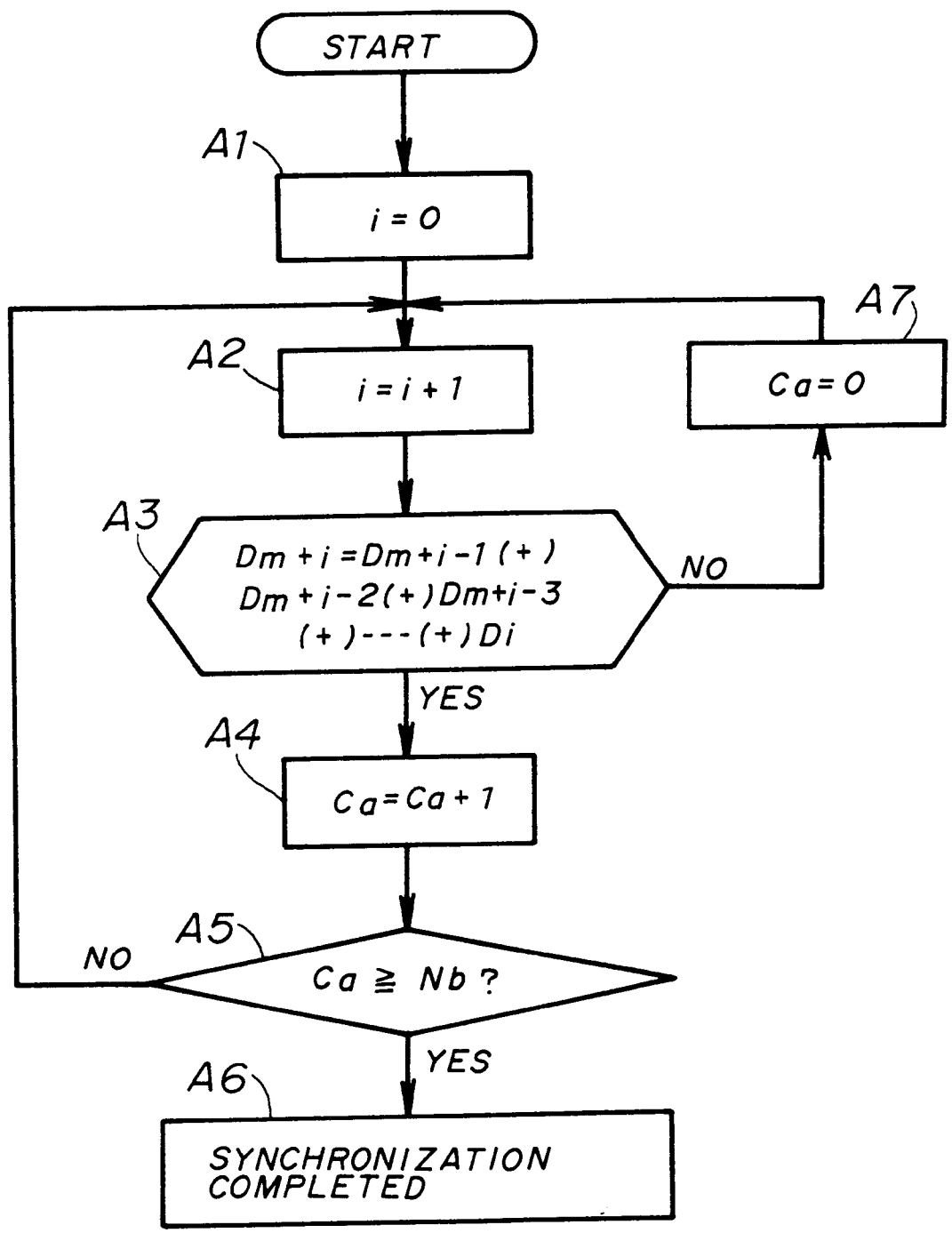
FIG. 3 is a flowchart of an operation of the first embodiment of the present invention.

FIG. 3 is a flowchart of the receive operation of the first embodiment of the present invention. At step (A1), parameter i is initialized so that i=0. At step (A2), the value of the parameter i is incremented by 1 (i=i+1). At step (A3), the exclusive-OR operation is carried out in which m denotes the predetermined number of bits to be subjected to the exclusive-OR operation. At step (A3), it is determined whether the (m+1)th Bit Dm+i coincides with the result of the exclusive-OR operation on the bits Di–Dm+i−1. A symbol (+) in FIG. 3 denotes the exclusive-OR operation. In the case shown in FIG. 2(b), m=7, and when i=1, then Dm+i−1(+)Dm+i−2(+)Dm+i−3(+) . . . (+)=D7(+)D6(+)D5(+)D4(+)D3(+)D2(+)D1 =P1. As has been described previously, the parity bits P1, P2, P3 and P4 has been subjected to the parity bit inversion/non-inversion process so as to form a predetermined pattern. Hence, at step (A3), each of bits Dm+i is inverted or not in accordance with the parity bit inversion/non-inversion process.

When the answer of step (A3) is NO, a counter Ca built in the backward protection circuit 14 is reset to 0, and the process returns to step (A2). When the answer of step (A3) is YES, the count value of the counter Ca is incremented by 1 (Ca=Ca+1) at step (A4), and it is determined whether the count value of the counter Ca becomes equal to or greater than the number Nb of stages for the backward protection. When the answer of step (A5) is NO, the process returns to step (A2). When the answer of step (A5) is YES, it is determined that the pull-in operation is completed at step (A6). It is possible to provide n counters Ca (i=1, 2, . . . , n). If there is any counter having the count value becomes equal to or greater than the number of stages for the backward protection, it will be possible to determine that the synchronization is established in a phase corresponding to the above counter.

Figure 4:
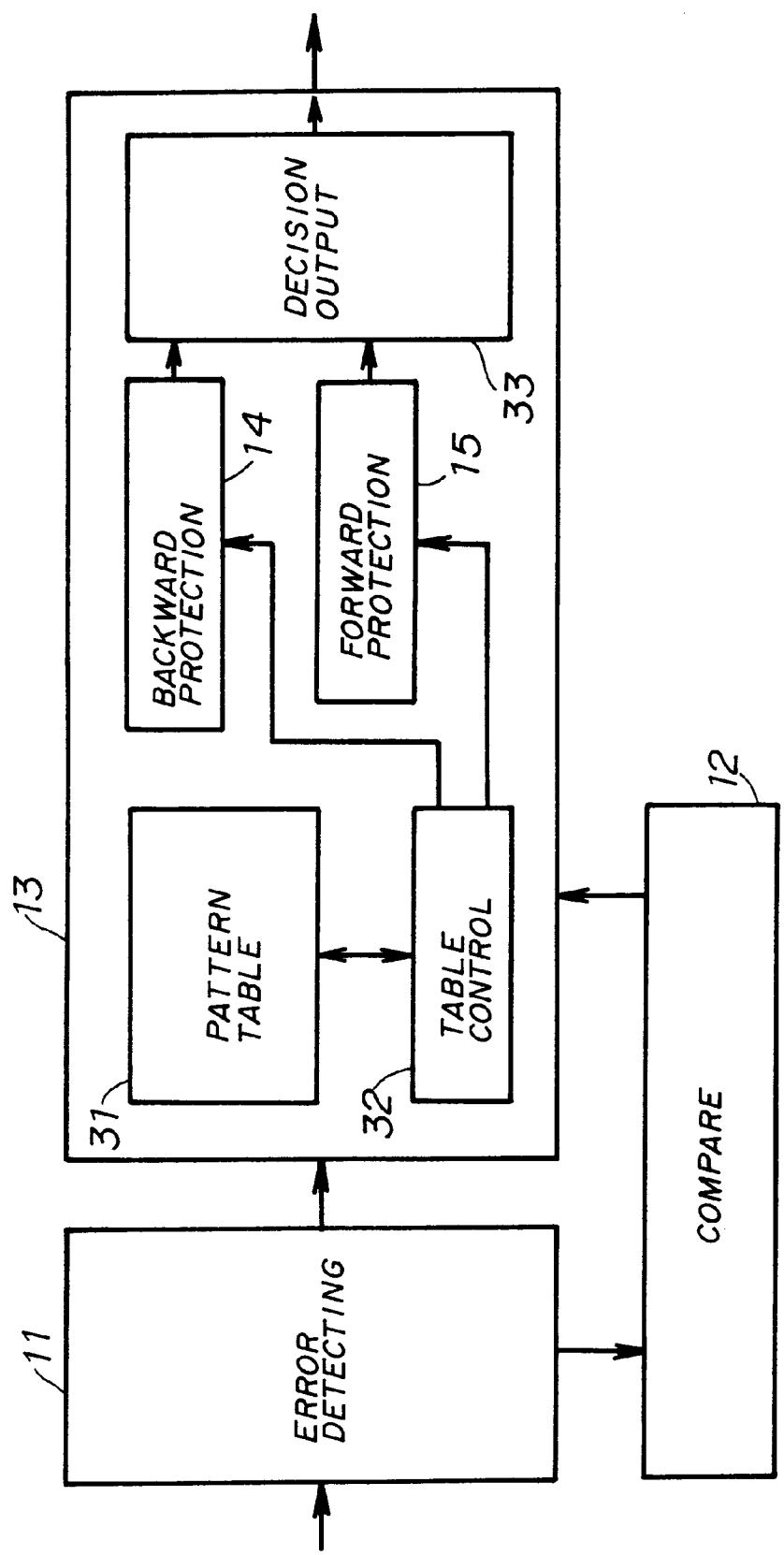
FIG. 4 is a block diagram of a second embodiment of the present invention.

FIG. 4 is a block diagram of a receive unit according to a second embodiment of the present invention. The receive unit shown in FIG. 4 includes the error detection part 11, the compare part 12 and the synchronization decision part 13. The receive process part 17 and the decoding part 16 shown in FIG. 1 are omitted from FIG. 4 for the sake of simplicity. The second embodiment of the present invention differs from the first embodiment thereof in that the synchronization decision part 13 includes a pattern table 31, a table control part 32, and a decision output part 33 in addition to the backward protection circuit 14 and the forward protection circuit 15. The pattern table 31 stores the results of the compare process executed by the compare part 12 for each of the coded information bits of the coded frame.

Figure 5:
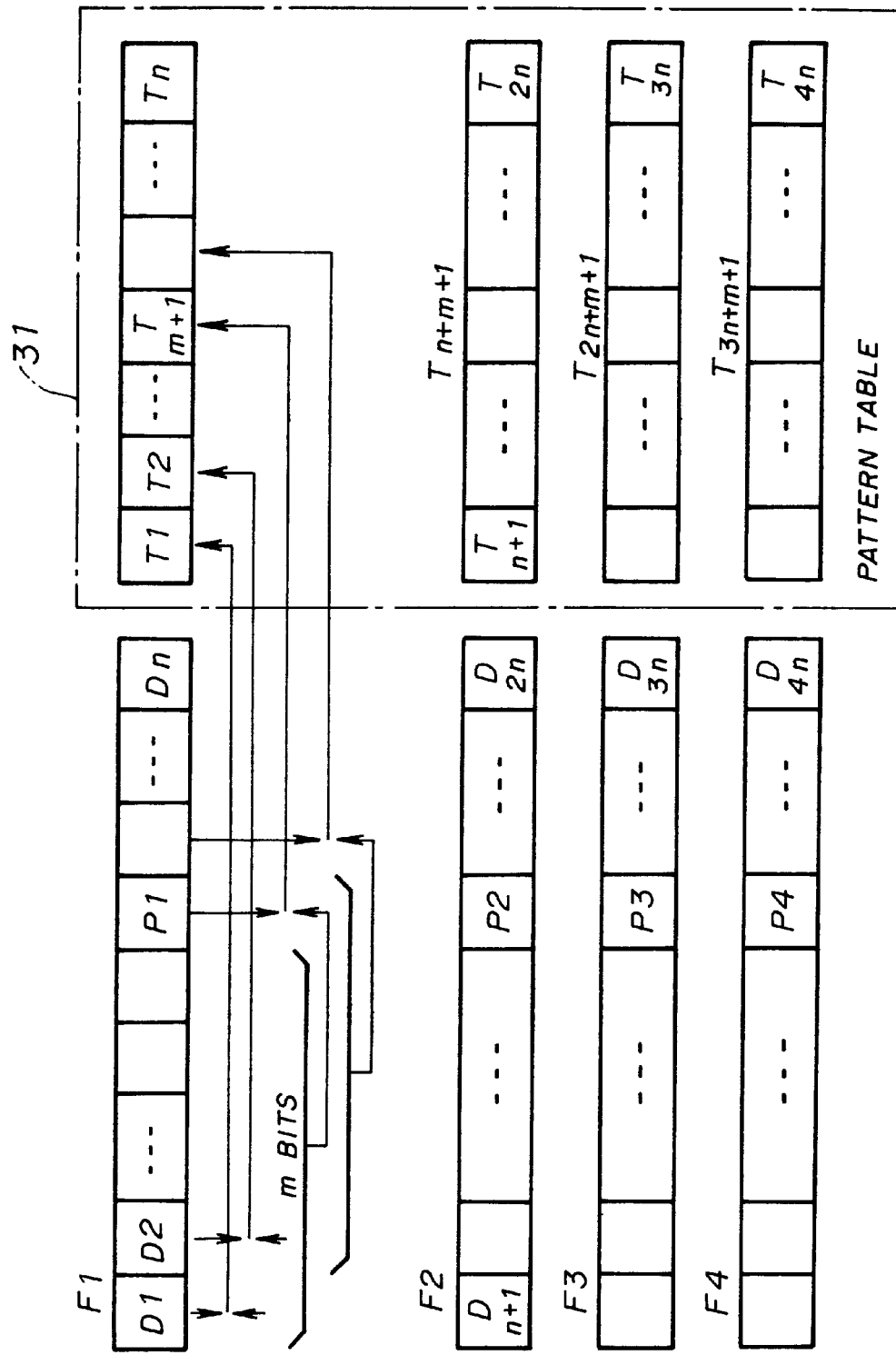
FIG. 5 is a diagram of a pattern table used in the second embodiment of the present invention.

FIG. 5 shows an example of the contents of the pattern table 31 related to four frames F1, F2, F3 and F4 respectively having coded information bits D1–Dn, Dn+1–D2n, D2n+1–D3n and D3n+1–D4n. As to the frame F1, the exclusive-OR operation on m bits is repeatedly executed in such a manner that the m bits to be subjected to the exclusive-OR operation is shifted one bit by one bit. Then, the result of the exclusive-OR operation on the m bits is compared with the (m+1)th bit. This comparing operation is repeatedly carried out for the respective results of the exclusive-OR operations. The results of the comparing operation are stored in the pattern table 31, as shown in FIG. 5. For example, T1 denotes the result of the comparing operation in which the result of the first m bits D1–Dm is compared with the (m+1)th bit Dm+1. In the above manner, the comparing results T1–Tn, Tn+1–T2n, T2n+1–T3n and T3n+1–T4n are stored in the pattern table 31.

Hence, the positions in the pattern table 31 which correspond to the positions of the parity bits P1–P4 included in the frames F1–F4 are Tm+1, Tn+m+1, T2n+m+1 and T3n+m+1, respectively. In the above-mentioned comparing operation, the parity bits P1–P4 are inverted or not in accordance with the predetermined pattern. If "0" is assigned to the match and "1" is assigned to the mismatch, the bits Tm+1, Tn+m+1, T2n+m+1 and T3n+m+1 corresponding to the parity bits P1, P2, P3 and P4 are all "0".

Hence, it is determined that the positions at which the comparison results of "0" for the frames F1–F4 are arranged in the vertical direction correspond to the positions of the parity bits P1–P4. The table control part 32 shown in FIG. 4 controls the pattern table 31 to store the comparison results therein and make the above decision on the contents thereof. When the table control part 31 recognizes the positions of the parity bits P1–P4, it increments the count value of the counter built in the backward protection circuit 14. If the table control part 32 cannot recognize the positions of the parity bits P1–P4, it resets the counter.

If the table control part 32 successively recognizes that the current positions of the parity bits P1–P4 coincide with the previously recognized positions, the table control part 32 causes the counter in the backward protection circuit 14 to continue to perform the count-up operation. When the count value becomes equal to or greater than the number of stages for the backward protection, the table control part 32 determines that the pull-in operation is completed, and instructs, via the decision output part 33, the decoding part 16 (not shown in FIG. 5) to start the decoding process from the leading end of the coded frame. After the synchronization is established, the forward protection circuit 15 increments the count value of the built-in counter if the positions of the parity bits P1–P4 are different from the previous positions or are not recognized. When the count value of the counter becomes equal to or greater than the number of stages for the forward protection, the decision output part 33 informs the decoding part 16 of the out-of-synchronization. Hence, the decoding process is stopped.

Figure 6:
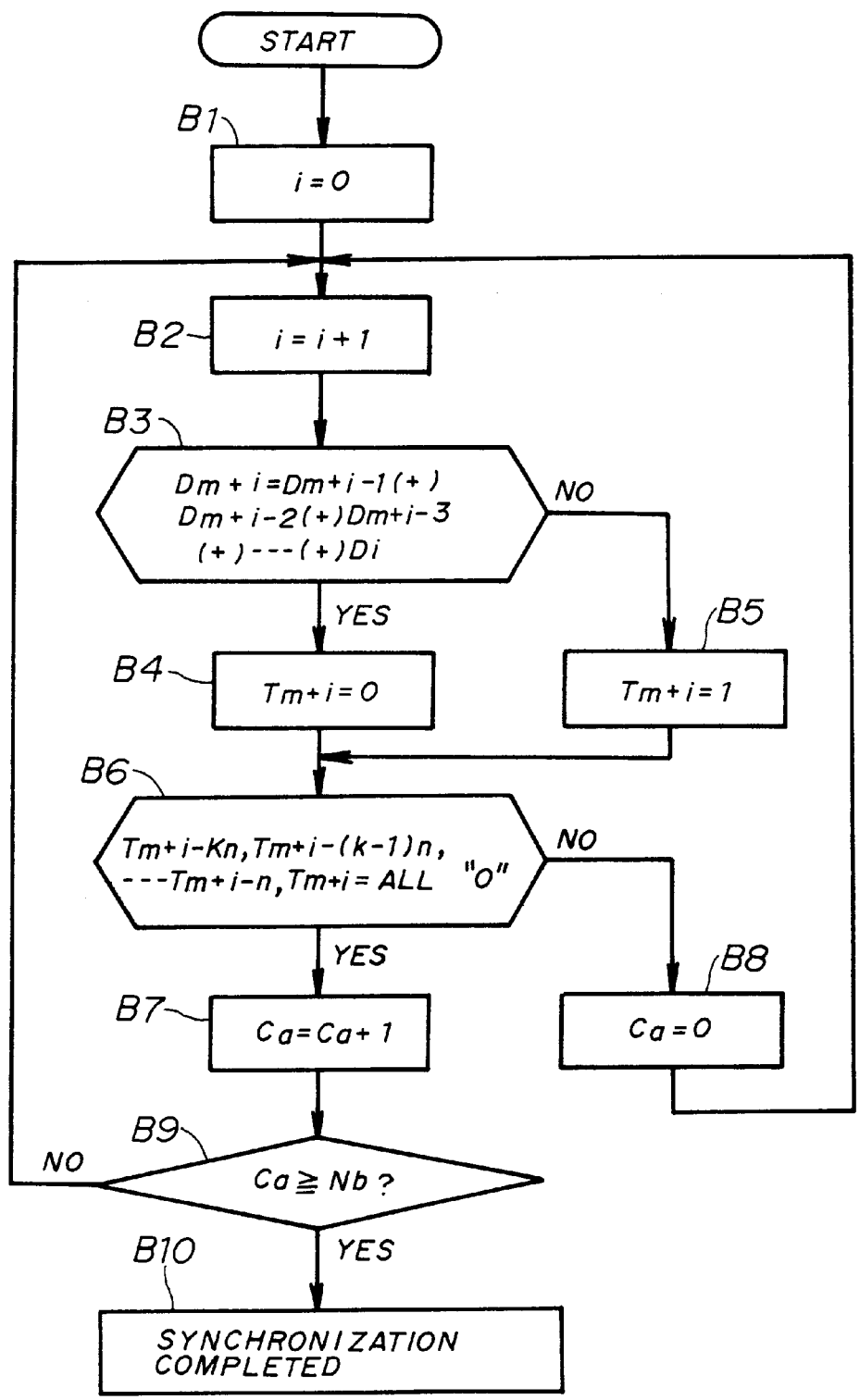
FIG. 6 is a flowchart of an operation of the second embodiment of the present invention.

FIG. 6 is a flowchart of the second embodiment of the present invention. In the third embodiment, one frame consists of n bits, and the redetermined number of bits is equal to m. at step (B1), the parameter i is initialized to 0. At step (B2), the value of the parameter i is incremented by 1 (i=i+1). The error detection part 11 executes the exclusive-OR operation on the bits Di–Dm+1–1 at step (B3). Further, at step (B3), the compare part 12 compares the result of the exclusive-OR operation with the bit Dm+1. In this case, "0" is assigned when the operation result coincides with the bit Dm+1, and "1" is assigned when the operation result does not coincide with the bit Dm+1. The comparison result is then written into the store position Tm+1 of the pattern table 31 corresponding to the bit Dm+1 at step (B4) or (B5).

If parameter "k" is defined as the number of frames forming the predetermined pattern, it is determined whether Tm+i–kn, Tm+i–(k–1)n, . . . , Tm+i–n, Tm+i are all "0" at step (B6). The term Tm+i–n proceeds, by n bits (one frame), to the term Tm+i stored in the pattern table 31. The term Tm+i–2n proceeds, by 2n bits (two frames), to the term Tm+i. The term Tm+i–kn proceeds, by kn bits (k frames), to the term Tm+i. If the terms Tm+i–kn, Tm+i–(k–1)n, . . . Tm+i–n, Tm+i are not all "0", it is determined that the bit Dm+i is not the parity bit for the error detection. Thus, the counter Ca built in the backward protection circuit 14 is reset to 0 at step (B8), and the process returns to step (B2).

When it is determined, at step (B6), that Tm+i–kn, Tm+i–(k–1)n, . . . , Tm+i–n, Tm+i are all "0", the bit Dm+i is located in the position where the parity bit is added. Hence, the count value of the counter Ca in the backward protection circuit 14 is incremented by 1 at step (B7), and it is determined, at step (B9), whether the count value of the counter Ca becomes equal to or greater than the number of frames for the backward protection. If the answer of step (B9) is YES, it is recognized at step (B10) that the pull-in process is completed. If the answer of step (B9) is NO, the process returns to step (B2). Hence, even when the error correction code is placed in an arbitrary position in the coded frame, the above position can be detected and the synchronization can be established. As in the case of the first embodiment of the present invention, counters Ca may be respectively provided to bits i (=1, 2, . . . , n), and it is determined whether any of the counters Ca becomes equal to or greater than the number of stages for the backward protection. If the answer is affirmative, the synchronization will be established in the phase of the counter Ca identified.

Information indicating the position (phase) in which the synchronization is established may be stored in the pattern table 31. Then, it is determined by the forward protection circuit 15 whether the frame is out of phase. If it is determined that the synchronization is not established, the pull-in operation is executed again with respect to the pull-in position (phase) stored in the pattern table 31 or another storage means. Hence, it is possible to speed up the pull-in operation.

At step (B6), the OR operations on the results of the comparing operation based on each coded information bit of each frame is carried out, and the position in which the results of the OR operation on the number of stages for the backward protection are "0" is determined as being the position in which the parity bit. In the case shown in FIG. 2(c) where a plurality of parity bits are added to one frame, it is also possible to store the results of the comparing operation on the error detection over a plurality of frames.

In this case, when the predetermined number of bits necessary for obtaining the parity bit is m and the comparison results are vertically arranged in the (m+1)th bit positions over frames, it is possible to determine that the parity bits are located in the bit positions which form a vertical alignment of "0" over frames. When the above bit positions are detected, the pull-in process is completed, and the leading ends of the frames can be identified by the bit positions in which the parity bits are arranged. Hence, the decoding process can be performed by extracting the coded information bits equal to one frame starting from the leading end of each frame. It is also possible to assign "1" to the match and assign "0" to the mismatch.

In the above description, the parity for error detection consists of a single bit. Alternatively, an error detection code consisting of a plurality of bits, such as the CRC code can be used. It is also possible to use an error correction code consisting of a plurality of bits, such as the BCH code. Even when such a plurality of bits are used for error detection or error correction, the parity bit inversion/non-inversion process is carried out before adding the parity bits to the frames in order to form a predetermined pattern.

A description will now be given of a case where various types of coded information such as voice information and facsimile information are transmitted on the frame base, some coded information does not require the error detection or correction process. In such a case, transmitter and receivers designed to conform with the respective types of coded information may be used. However, this is not good in terms of economical viewpoints. With the above in mind, when encoded information which does not require any error detection or correction code is employed, a frame is formed by placing a particular type indication code in the position in which the error detection or correction code should originally be placed.

The receive unit which receives such a frame can be configured as shown in FIGS. 1 and 5. Then the results of the error detection carried out every predetermined number of bits are compared with the corresponding error detection or correction codes. If the comparing operations are carried out the number of times equal to the number of stages for the backward protection, the particular type indication codes are detected and it is determined whether the particular type indication codes equal in number to the stages for the backward protection form a predetermined pattern. The result of the above determination is affirmative, the pull-in operation using the particular type indication code can be completed while the type of coded information is identified. It is possible to switch the decoding sequence of the decoding part on the basis of the identified type of coded information. The structure of the synchronization decision part 13 can be used in common to the types of coded information.

In the transmission of coded information of voice, the frame structure of coded information for silent data (no voice) is indefinite during communication. Such an indefinite frame is transmitted to the receive side, the above-mentioned pull-in operation may be carried out or the pseudo-pulled-in-synchronization state may occur. Hence, the quality of reproduced voice will be degraded greatly. Hence, if there is a high possibility that the pseudo-pulled-in-synchronization state may occur, coded information obtained when there is no voice, a special synchronization code is added to the position in which the error detection or correction code should originally be placed.

On the receive side, the pull-in operation is performed by detecting the positions of the error detection or correction code as has been described previously. If the pull-in operation fails over the number of stages for the backward protection, the detection of the special synchronization code is initiated for establishing the synchronization. The special synchronization code may be formed so as to have a pattern which is the same as or similar to that of the synchronization bits. It is required to start the decoding process when the pull-in process is carried out because the pull-in process is based on silent data.

Figure 7:
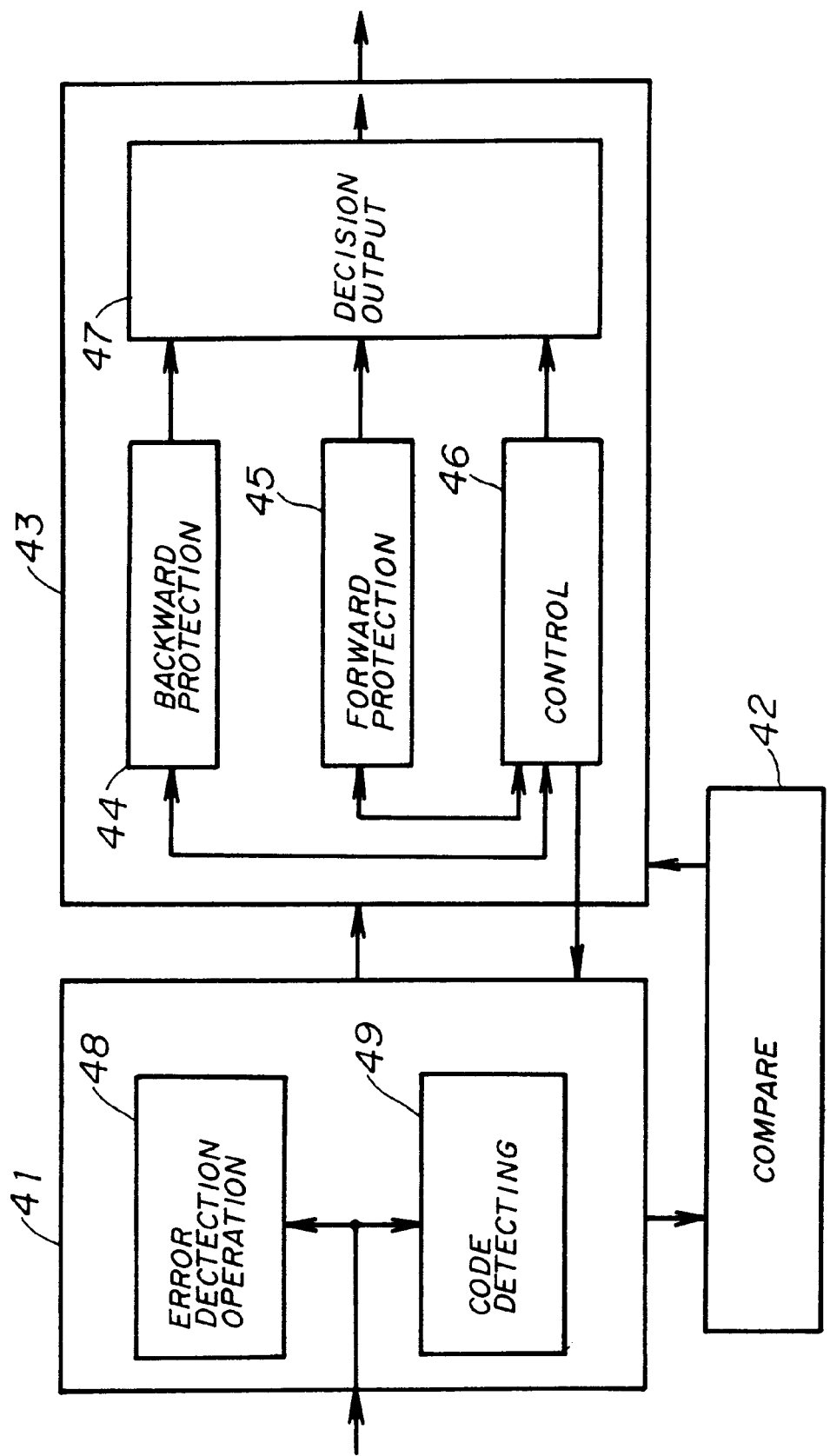
FIG. 7 is a block diagram of a third embodiment of the present invention.

A description will now be given of a third embodiment of the present invention by referring to FIG. 7, which shows a structure of the receive unit. As shown in FIG. 7, the receive unit includes an error detection part, a compare part 42, a synchronization decision part 43, a backward protection circuit 44, a forward protection circuit 45, a control part 46, a decision output part 47, an error detection operation part 48 and a code detection part 49. The error detection part 41 includes the error detection operation part 48 and the code detection part 49. The synchronization decision part 43 includes the backward protection circuit 44, the forward protection circuit 45, the control part 46 and the decision output part 47. The receive processing part and the decoding part are omitted for the sake of simplicity.

The error detection operation unit 48 performs a detection operation every predetermined number of bits, and supplies the compare part 42 with the results of the operation and the error detection or correction code which should be added every predetermined number of bits. The compare part 42 compares the comparison results to the synchronization decision part 43. A built-in counter of the backward protection circuit 44 counts the match signal, and is reset by the mismatch signal. When the counter value becomes equal to or greater than the number of stages for the backward protection, the control part 46 determines that the pull-in process is completed. Then, the decision output part 47 supplies the decoding part of the next stage with coded information equal to one frame from the leading end of the frame based on the pull-in phase.

If the pull-in process is incomplete even when the process is repeatedly carried out over the number of times equal to the number of stages for the backward protection, the control part 46 applies a switch instruction so as to select the code detection part 49 rather than the error detection operation part 48. In the system which employs the aforementioned particular type indication code, the control part 46 controls the code detection part 49 to detect the above code. In the system which employs the aforementioned special synchronization code, the control part 46 controls the code detection part 49 to detect the above code.

For example, the code extracted with the period equal to the frame is compared with the predetermined pattern by the compare part 42. The counter of the backward protection circuit 44 counts the match signal, and is reset by the mismatch signal. When the count value is equal to or greater than the number of stages for the backward protection, it is determined that the pull-in process is completed. Then, coded information equal to one frame starting from the leading end of the coded frame is transferred to the decoding part together with information concerning the detected unique code.

If the synchronization is established by detecting the special synchronization code, the reliability or stability of received coded information is not ensured. Hence, the decoding process is not initiated, and the error detection operation unit 48 is made to continue to operate in order to wait for receipt of the frame having the error detection or correction code.

If the transmit unit cannot send normal coded frames due to a certain cause, the transmit unit intentionally causes the receive unit to be out of synchronization and thus stop the decoding process. In this case, the following three methods can be employed. The first method omits the error detection or correction code added for the pull-in process. The second method adds an error detection or correction code having a different pattern from that of the error detection or correction code added for the pull-in process. The third method adds a specific synchronization code as has been described before instead of the error detection or correction code added for the pull-in process. The error detection part 41, the compare part 42 and the synchronization decision part 43 operate by a corresponding one of the first through third methods. If it is determined that the receive system becomes asynchronous, the decoding process of the decoding part is stopped.

Figure 8:
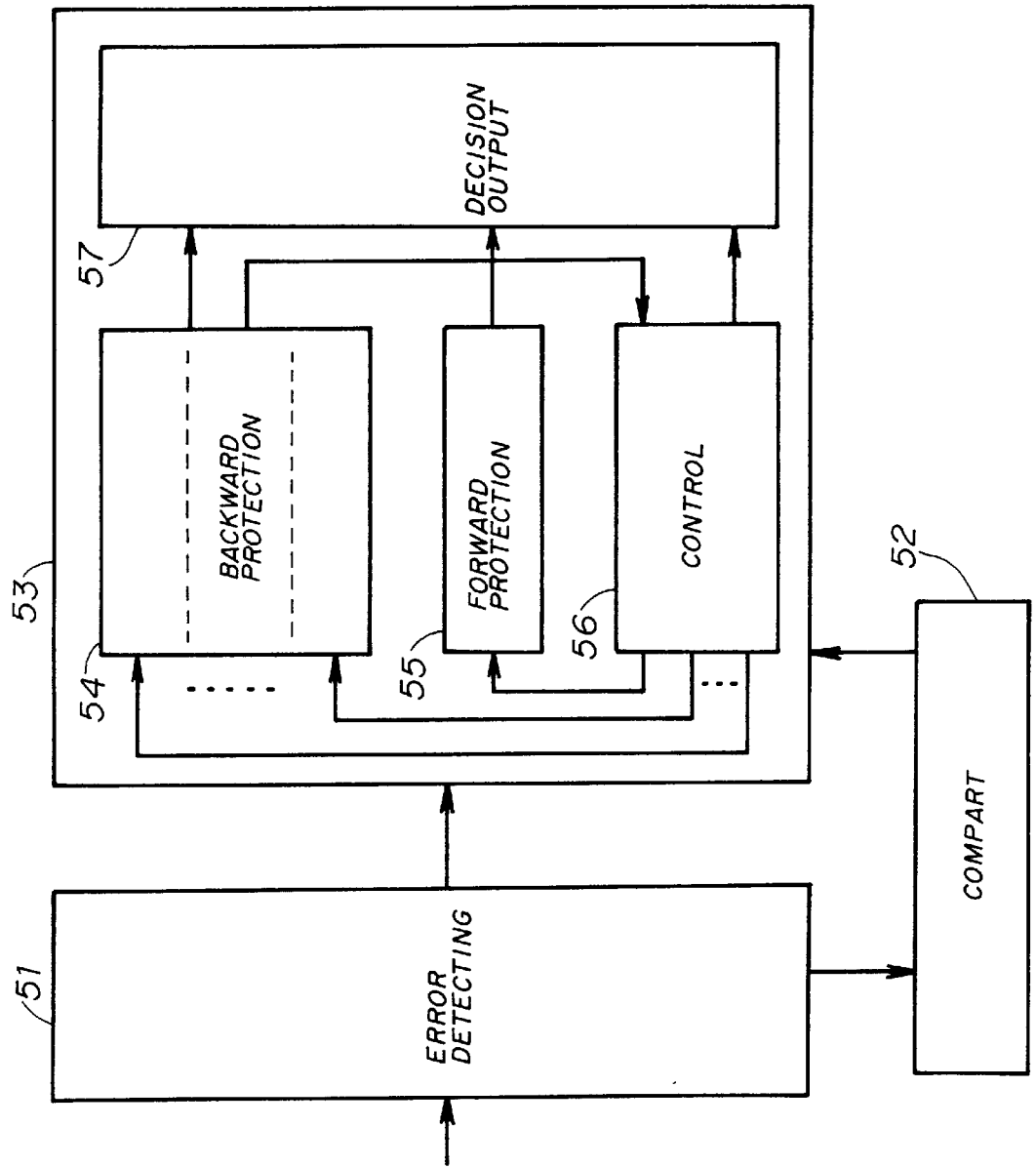
FIG. 8 is a block diagram of a fourth embodiment of the present invention.

FIG. 8 is a block diagram of a receive unit according to a fourth embodiment of the present invention. The receive unit shown in FIG. 8 includes an error correction part 51, a compare part 52 and a synchronization decision unit 53. The receive processing part and the decoding part are omitted for the sake of simplicity. The synchronization decision unit 53 is made up of a backward protection circuit 54, a forward protection circuit 55, a control part 56 and a decision output part 57. The backward protection circuit 54 has counters respectively provided to the phases with which the synchronization can be established. The control parts checks the counter values of the counters. If the count value of one of the counters becomes equal to or greater than the number of stages for the backward protection, it is determined that the pull-in is completed.

If the count values of some counters become equal to or greater than the number of stages for the backward protection, the counter values except for only one indicate pseudo-pull-in-synchronization states. Hence, it is not determined that the synchronization is established. That is, when only one pull-in phase is detected, the decoding process is initiated. Hence, it is possible to avoid the pseudo-pull-in-synchronization states.

Figure 9:
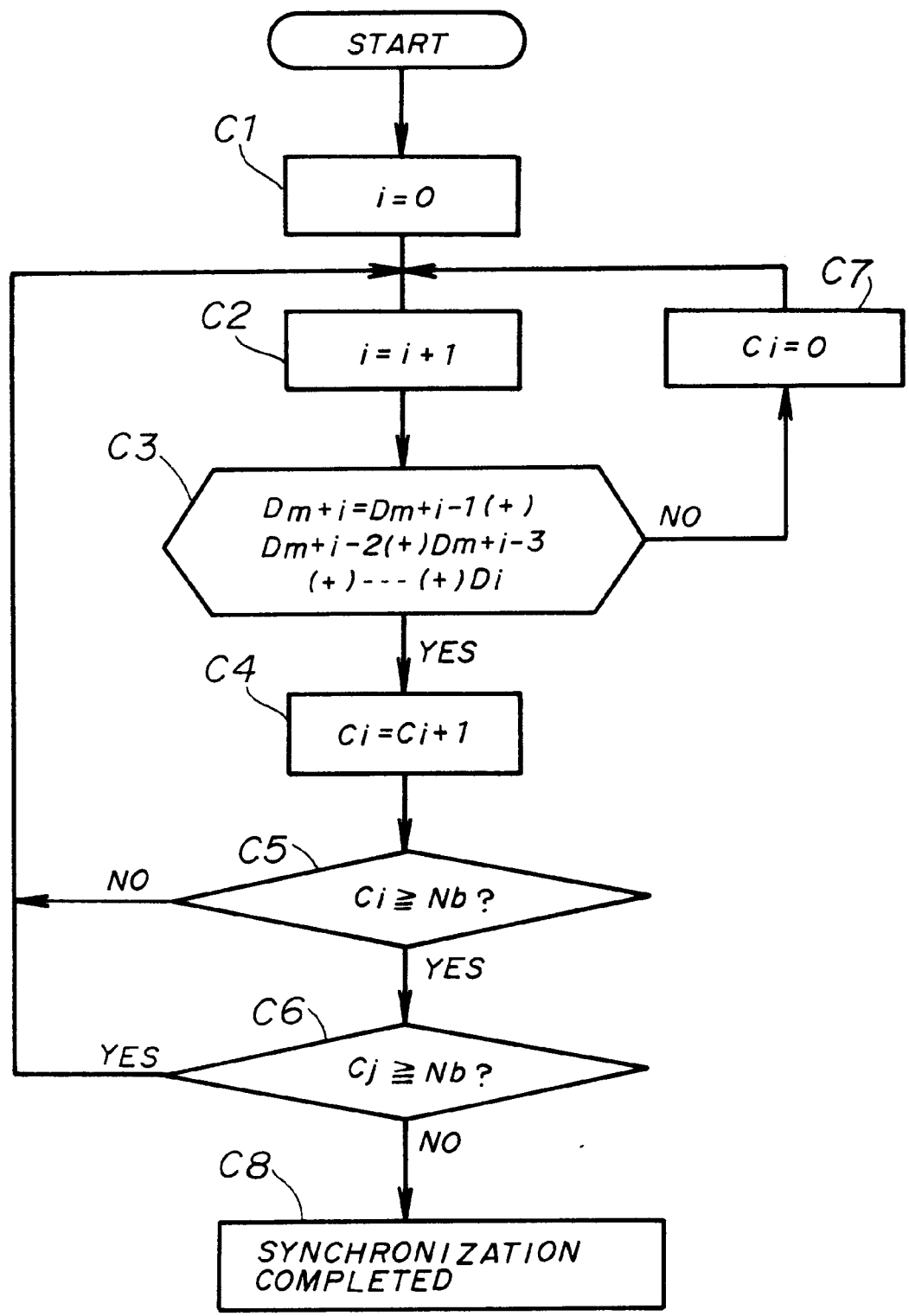
FIG. 9 is a flowchart of an operation of the fourth embodiment of the present invention.

FIG. 9 is a flowchart of the operation of the fourth embodiment of the present invention. Steps (C1)–(C5) and (C7) are almost the same as steps (A1)–(A5) and (A7), respectively. The counters Ci of the backward protection circuit 54 are provided for the respective phases with which the synchronization can be established. For example, if i=7 at step (C2) at which the count value i is incremented by 1, at step (C3), the bit Dm+7 is compared with the result of the exclusive-OR operation on the predetermined number m of bits, namely Dm+6(+)Dm+5(+) . . . Di. When the result of the operation coincides with the bit Dm+7, the count value of the counter Ci is incremented by 1. When the result of the operation does not coincide with the bit Dm+7, the count value of the counter Ci is cleared.

The above process is repeatedly carried out until i is equal to 1 to n. It is determined at step (C5) whether the count value of the counter Ci is equal to or greater than the number of stages for the backward protection. When the answer is YES, it is determined at step (C6) whether the count value of the counter Cj (j is not equal to i) is equal to or greater than the number of stages for the backward protection. When the answer of step (C6) is YES, there are a plurality of pull-in phases. Hence, the process returns to step C2. When the answer of step (C6) is NO, it is determined at step (C8) that the received signal is pulled in synchronization with only the phase corresponding to the counter Ci.

Figure 10:
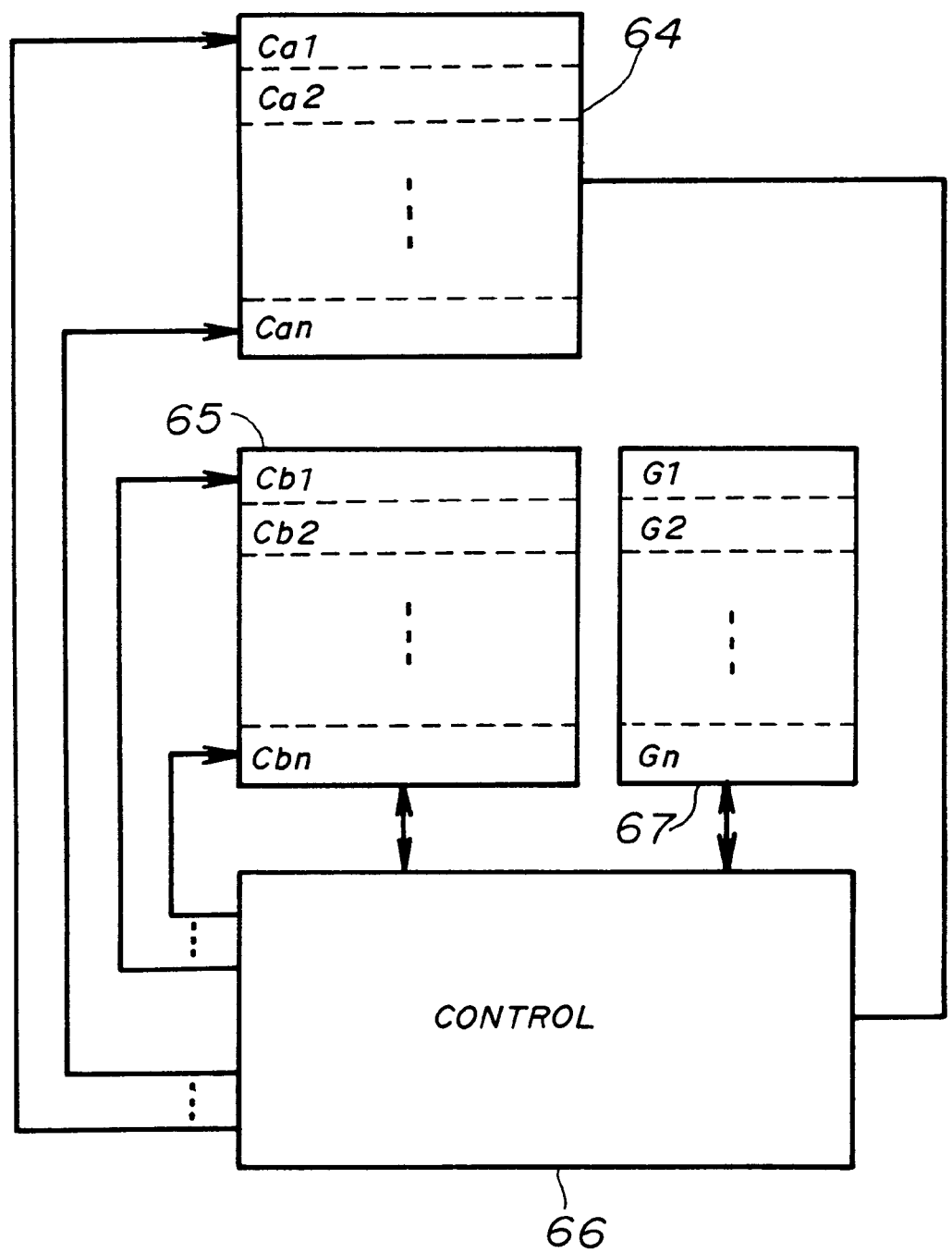
FIG. 10 is a block diagram of a fifth embodiment of the present invention.

FIG. 10 is a block diagram of a receive unit according to a fifth embodiment of the present invention. The receive unit shown in FIG. 10 includes a backward protection circuit 64, a forward protection circuit 65, a control part 66, and an out-of-synchronization memory part 67. The backward protection circuit 64 includes counters Ca1–Can corresponding to respective phases with which the synchronization can be established. The forward protection circuit 65 includes counters Cb1–Cbn corresponding to respective phases with which the synchronization can be established. The out-of-synchronization of the memory part 67 has memory areas G1–Gn in which information concerning how frequently the out-of-synchronization occurs for each of the phases corresponding to the counters Cb1–Cbn of the forward protection circuit 65.

The counters Ca1–Can of the backward protection circuit 64 increment the count values in response to the corresponding match signals and are reset by the corresponding mismatch signals. The above operation is repeatedly carried out. When only one of the counters has a count value equal to or greater than the number of stages for the backward protection, the control part 66 determines that the pull-in process is completed. Thereafter, the counters Ca1–Can increment the respective count values in response to the corresponding match signals, and monitor occurrence of a situation in which two or more phases with which the synchronization can be established.

After the synchronization is established, the counter of the forward protection circuit 64 increments its count value in response to the mismatch signal, and is reset by the match signal. The above operation is repeatedly carried out. When the count value is equal to or greater than the number of stages for the backward protection, it is determined that the receive unit is out of synchronization. The count values of the counters Cb1–Cbn of the forward protection circuit 65 are stored in the memory areas G1–Gn of the out-of-phase memory part 67.

For example, if the synchronization is established with the phase corresponding to the counter Ca1 of the backward protection circuit 64, the count values of the counters Cb1–Cbn of the forward protection circuit 65 are stored in the memory areas G1–Gn of the out-of-phase memory part 67. The control part 66 determines whether the content of the memory area G1 is less than the contents of the memory areas G2–Gn.

If the contents of the memory areas G2–Gn are less than the content of the memory area G1 having the phase with which the synchronization is established, the number of stages for the forward protection is temporarily reduced. Hence, it is possible to rapidly determine that the currently processed phase is out of synchronization. In the pseudo-pulled-in-synchronization state, the result of mismatch may frequently occur, as compared to the correct phase with which the synchronization can duly be established. Hence, the contents of the memory areas of the memory part 67 corresponding to phases of out-of-synchronization are comparatively great. It is also possible to store, in the memory areas G1–Gn of the memory part 67, information indicative of the frequency at which the result of match is obtained.

In this case, the match signals related to the other phases are counted up in the backward protection circuit 64. Hence, it is possible to rapidly pull the receive unit in synchronization again. Even if the receive unit is in the pseudo-pulled-in-synchronization state, it is determined by the other counters, that this state is out of synchronization.

The frame synchronization circuit used in each of the embodiments of the present invention can be implemented by hardware or an operation processing of a processor. In this case, the memory can be initialized after the synchronization is established. However, a certain area of the memory is ensured to make it possible for the processor to execute the pull-in process.

The present invention is not limited to the specifically disclosed embodiments, and variations and modifications may be made without departing from the scope of the present invention.

What is claimed is:

1. A coded frame synchronization method for decoding coded information sent every frame, comprising the steps of:
   (a) receiving a coded frame having error detection or correction codes, each of which is provided every predetermined number of bits, error detection or correction codes being added to the coded frame in accordance with a predetermined pattern;
   (b) pulling the coded frame in synchronization by performing an error detection process every predetermined number of bits to be compared with results of the error detection process and thus detecting a phase of the error detection or correction codes; and
   (c) recognizing a leading end of the coded frame on the basis of the phase of the error detection or correction codes.

2. A coded frame synchronization method for decoding various types of coded information sent every frame, comprising the steps of:
   (a) receiving a coded frame having error detection or correction codes, each of which is provided every predetermined number of bits, error detection or correction codes being added to the coded frame in accordance with a predetermined pattern;
   (b) receiving another coded frame of a particular type having particular type indication codes rather than the error detection or correction codes;
   (c) pulling the coded frame in synchronization by performing an error detection process every predetermined number of bits to be compared with results of the error detection process and thus detecting a phase of the error detection or correction codes;
   (d) pulling said another coded frame in synchronization by detecting a phase of the particular type indication codes;
   (e) recognizing a leading end of the coded frame on the basis of the phase of the error detection or correction codes; and
   (f) recognizing a leading end of said another frame on the basis of the phase of the particular type indication codes.

3. A coded frame synchronization method for decoding coded information sent every frame, comprising the steps of:
   (a) receiving a coded frame having error detection or correction codes, each of which is provided every predetermined number of bits, error detection or correction codes being added to the coded frame in accordance with a predetermined pattern;
   (b) receiving another coded frame having special synchronization codes rather than the error detection or correction codes if the error detection or correction codes are not duly received at step (a);
   (c) pulling the coded frame in synchronization by performing an error detection process every predetermined number of bits to be compared with results of the error detection process and thus detecting a phase of the error detection or correction codes;
   (d) pulling, if the step (c) fails over a number of stages for backward protection, said another coded frame in synchronization by detecting a phase of the special synchronization codes;
   (e) recognizing a leading end of the coded frame on the basis of the phase of the error detection or correction codes; and
   (f) recognizing a leading end of said another frame on the basis of the phase of the special synchronization codes.

4. A coded frame synchronization method for decoding coded information sent every frame, comprising the steps of:
   (a) receiving a coded frame having error detection or correction codes, each of which is provided every predetermined number of bits, error detection or correction codes being added to the coded frame in accordance with a predetermined pattern;
   (b) receiving another coded frame having special codes rather than the error detection or correction codes;
   (c) pulling the coded frame in synchronization by performing an error detection process every predetermined number of bits to be compared with results of the error detection process and thus detecting a phase of the error detection or correction codes;
   (d) recognizing a leading end of the coded frame on the basis of the phase of the error detection or correction codes; and
   (e) recognizing that a synchronization is not established if the step (c) fails over a number of stages for backward protection or the special codes are detected.

5. The method as claimed in claim 4, further comprising the steps of:
   maintaining, if the current state is changed from a synchronized state to an out-of-synchronization state, a phase of the synchronized state immediately before the current state is changed; and
   pulling the coded frame with the phase maintained.

6. A coded frame synchronization method for decoding coded information sent every frame, comprising the steps of:
   (a) receiving a coded frame having error detection or correction codes, each of which is provided every predetermined number of bits, error detection or correction codes being added to the coded frame in accordance with a predetermined pattern;
   (b) pulling the coded frame in synchronization by performing an error detection process every predetermined number of bits to be compared with results of the error detection process and thus detecting a phase of the error detection or correction codes;

(c) pulling the coded frame in synchronization with phases other than said phase of the error detection or correction codes;

(d) determining that a synchronization is not yet established if there are a plurality of phases with which the synchronization can be established; and (e) recognizing that the synchronization is established if the coded frame can continuously be pulled, for a number of stages for backward protection, in synchronization with only one of the phrases.

7. A coded frame synchronization method for decoding coded information sent every frame, comprising the steps of:

(a) receiving a coded frame having error detection or correction codes, each of which is provided every predetermined number of bits, error detection or correction codes being added to the coded frame in accordance with a predetermined pattern;

(b) pulling the coded frame in synchronization by performing an error detection process every predetermined number of bits to be compared with results of the error detection process and thus detecting a phase of the error detection or correction codes;

(c) pulling the coded frame in synchronization with phases other than said phase of the error detection or correction codes;

(d) storing a frequency of occurrence of an out-of-synchronization for each of the phases with which the coded frame is pulled in synchronization;

(e) comparing a first frequency of occurrence of the out-of-synchronization related to a current phase for a number of stages for forward protection with second frequencies of occurrence of the out-of-synchronization with other phases; and (f) reducing the number of stages for forward protection when the first frequency is greater than the second frequencies.

8. A coded frame synchronization circuit which decodes coded information sent every frame, comprising:

an error detection part which receives a coded frame having error detection or correction codes, each of which is provided every predetermined number of bits, error detection or correction codes being added to the coded frame in accordance with a predetermined pattern and which performs an error detection process every predetermined number of bits;

a compare part which compares the error detection or correction codes extracted from the coded frame with results of the error detection process carried out by the error detection part in accordance with the predetermined pattern;

a synchronization decision part which determines that a synchronization is established when a match signal from the compare part is repeatedly received a number of times equal to a number of stages for backward protection and which determines that an out-of-synchronization occurs when a mismatch signal from the compare part is repeatedly received in a synchronized state the number of times equal to the number of stages for backward protection.

9. The coded frame synchronization circuit as claimed in claim 8, wherein:

said error detection part has a structure which receives another coded frame of a particular type having particular type indication codes rather than the error detection or correction codes and which performs the error detection process for another coded frame;

said compare part has a structure which compares the particular type indication codes extracted from the coded frame with results of the error detection process carried out by the error detection part in accordance with the predetermined pattern; and the match signal used in said synchronization decision part is related to the error detection or correction codes or the particular type indication codes.

10. The coded frame synchronization circuit as claimed in claim 8, wherein:

said error detection part has a structure which receives another coded frame having special synchronization codes rather than the error detection or correction codes if the error detection or correction codes are not duly received;

said compare part has a structure which compares the special synchronization codes extracted from the coded frame with results of the error detection process carried out by the error detection part in accordance with the predetermined pattern; and the synchronization decision part includes a backward protection part which counts the number of times that a match signal from the compare part is received, and a forward protection part which counts the number of times that a mismatch signal from the compare part is received, the synchronization decision part controlling the error detection part to detect the special synchronization codes when the backward protection circuit fails to count the match signal a number of times equal to a number of stages for backward protection by the backward protection circuit.

11. The coded frame synchronization circuit as claimed in claim 8, wherein:

said error detection part has a structure which receives another coded frame having special codes rather than the error detection or correction codes if the synchronization cannot be established with the error detection or correction codes;

said compare part has a structure which compares the special codes extracted from the coded frame with results of the error detection process carried out by the error detection part in accordance with the predetermined pattern; and the synchronization decision part includes a backward protection part which counts the number of times that a match signal from the compare part is received, and a forward protection part which counts the number of times that a mismatch signal from the compare part is received, the synchronization decision part controlling the error detection part to detect the special codes when the backward protection circuit fails to count the match signal a number of times equal to a number of stages for backward protection by the backward protection circuit.

12. The coded frame synchronization circuit as claimed in claim 8, wherein:

the compare part compares the error detection or correction codes extracted with different frames from the coded frame with results of the error detection process carried out by the error detection part with different phrases in accordance with the predetermined pattern; and the synchronization decision part includes a backward protection part which counts the number of times that a match signal from the compare part is received, and a forward protection part which counts the number of times hat a mismatch signal from the compare part is received, the synchronization decision part determining that the synchronization is established when the backward protection circuit counts, with respect to only one of the phrases, the match signal a number of times equal to a number of stages for backward protection by the backward protection circuit.

13. The coded frame synchronization circuit as claimed in claim 8, wherein:

the compare part compares the error detection or correction codes extracted with different frames from the coded frame with results of the error detection process carried out by the error detection part with different phrases in accordance with the predetermined pattern; and the synchronization decision part includes a backward protection part which counts the number of times a match signal from the compare part is received, a forward protection part which counts the number of times that a mismatch signal from the compare part is received, and a decision output part which temporarily reduces the number of stages for forward protection by the forward protection pat when the count value of the forward protection part with respect to the phase with which the synchronization is established becomes less than the count values of the forward protection part with respect to the other phrases.

* * * * *